(12) United States Patent
Casper et al.

(10) Patent No.: US 7,327,620 B2
(45) Date of Patent: Feb. 5, 2008

(54) DIFFERENTIAL INPUT BUFFER FOR RECEIVING SIGNALS RELEVANT TO LOW POWER

(75) Inventors: Steve Casper, Boise, ID (US); Scott Van De Graaff, Boise, ID (US)

(73) Assignee: Mircon Technology, Inc., Boise, ID (US)

( * ) Notice: Subject to any disclaimer, the term of this patent is extended or adjusted under 35 U.S.C. 154(b) by 240 days.

(21) Appl. No.: 10/865,218

(22) Filed: Jun. 10, 2004

(65) Prior Publication Data

US 2005/0276145 A1    Dec. 15, 2005

(51) Int. Cl.
*G11C 7/02* (2006.01)

(52) U.S. Cl. ............... 365/207; 365/191; 365/230.08; 365/189.05

(58) Field of Classification Search ............. 365/227, 365/189.09, 207, 189.05, 205, 233, 191, 365/230.08
See application file for complete search history.

(56) References Cited

U.S. PATENT DOCUMENTS

| | | | | |
|---|---|---|---|---|
| 5,532,620 A | * | 7/1996 | Seo et al. ............... | 326/81 |
| 5,834,974 A | * | 11/1998 | Kim ....................... | 327/52 |
| 5,900,745 A | * | 5/1999 | Takahashi ............... | 326/64 |
| 6,252,435 B1 | * | 6/2001 | Wu et al. ................ | 327/65 |
| 6,252,467 B1 | * | 6/2001 | Yoshimura .............. | 331/57 |
| 6,348,815 B1 | * | 2/2002 | Sim ........................ | 326/86 |
| 6,414,517 B1 | * | 7/2002 | Kim et al. ............... | 326/88 |
| 6,812,743 B2 | * | 11/2004 | Kim ........................ | 326/83 |
| 6,891,763 B1 | * | 5/2005 | Han ................... | 365/189.05 |
| 2003/0030476 A1 | * | 2/2003 | Cowles et al. ........... | 327/318 |
| 2003/0067328 A1 | * | 4/2003 | Wright et al. ........... | 327/108 |

* cited by examiner

*Primary Examiner*—Thong Q. Le
(74) *Attorney, Agent, or Firm*—Wong, Cabello, Lutsch, Rutherford, & Brucculeri, LLP

(57) ABSTRACT

Disclosed herein are exemplary embodiments of an improved differential input buffer for receiving low power signals and associated methods. The disclosed buffer circuit comprises at least one differential amplifier for receiving as inputs an enable signal (e.g., a clock enable signal) and a reference signal, and provides a differential amplifier output representative of a comparison of the magnitude of the input signals. As improved, input buffer circuitry comprises a pull up stage to pull up the voltage of the differential amplifier output slightly higher during an output low condition. The pull up stage is preferably, but not necessarily, activated only during a problematic condition, such as when both input signals to the differential amplifier are low. By pulling up the output, the input buffer circuit enjoys improved margin, and is able to reliably signal a low power condition even when both inputs are low.

72 Claims, 4 Drawing Sheets

DIFFERENTIAL INPUT BUFFER FOR RECEIVING SIGNALS RELEVANT TO LOW POWER

FIELD OF THE INVENTION

This invention relates to an improved differential input buffer circuit for receiving signals relevant to placing an integrated circuit into a low power mode.

BACKGROUND

As is known in the art of semiconductor integrated circuits or "chips," chips can be placed in s a stand-by or low power mode designed to save power in the system in which the chip resides. In this regard, and referring to FIG. 1, a first chip in a system (e.g., a microprocessor 8) might send a signal or signals to a second chip in a system (e.g., a dynamic random access memory (DRAM) 8) to inform the second chip to go into a low power state. In response, the second chip might disconnect or tri state certain circuit paths that draw current or shut off its internal clocks to save power.

Certain devices such as DRAMs can receive two system signals relevant to assuming a low power status. For example, two signals CKE (clock enable) and Vref (a reference voltage normally approximately half the power supply, or Vcc/2) can be input to the DRAM 9, and specifically are input to the input buffer circuitry 10 of FIG. 1. As shown, the input circuitry 10 consists of two differential amplifiers: a P-channel amplifier 11a, and a N-channel amplifier 11b. The outputs 15 of both differential amplifiers 11a, 11b are tied together, which is beneficial to compensate for potential inconsistencies in the N- and P-channels transistors which form the circuits. (However, in other applications, only one amplifier 11a, 11b individually could be used). In any event, the common output 15 of the amplifiers 11a, 11b (or single output if only one amplifier 11a, 11b is used), are typically sent to an inverter 14, which buffers the amplifier output to produce reliable Vcc (logic high; logic '1') and ground (GND; logic low; logic '0') signals (Vout) to the clocking circuitry of the DRAM (not shown).

As is well known, the differential amplifiers 11a, 11b compare the input signals Vref and CKE and seek to drive Vout to logic signals depending on the comparison. As illustrated, and generally speaking, when Vref>CKE, the output 15 of the amplifiers is a logic '1,' and Vout from the inverter 14 is a logic '0,' which is sent to the DRAM 9's clocking circuitry to indicate that the DRAM 9's clocks should be disabled and otherwise that the DRAM 9 should be placed in a low power mode. Conversely, when Vref<CKE, the output 15 of the amplifiers is a logic '0,' and Vout from the inverter 14 is a logic '1,' which is sent to activate the DRAM 9's clocking circuitry and otherwise to indicate that the DRAM should not be placed in a low power mode.

Thus, generally speaking, Vref>CKE indicates a low power condition for the DRAM 9, while Vref<CKE indicates that power is enabled. More specifically, when CKE is taken low by the system (i.e., <Vref), the clocks within the DRAM 9 are disabled, which causes the DRAM to draw less current, which saves system power.

In addition to taking CKE low to save power, several DRAM-based systems have investigated grounding Vref during DRAM self refresh to save system power. Thus, at certain times, Vref might also be taken low by the system as an additional system power saving measure.

However, the occurrence of CKE and Vref both being low can cause problems. First, if Vref=CKE=logic '0,' the differential amplifiers 11a, 11b are potentially, and generally speaking, in a somewhat indeterminable state, as neither Vref nor CKE are obviously predominating over one another. More accurately, the differential amplifiers 11a, 11b may only change state when a small differential voltage, Δ, exists between Vref and CKE—i.e., the amplifiers change state and enters the low power condition when CKE+Δ<Vref, and enters the power enabled condition when CKE+Δ>Vref. This differential voltage Δ is difficult to control as it will vary from circuit to circuit depending on process or design variations in the fabrication of the DRAM 9.

Assume as shown in FIG. 4 that a small positive differential voltage, Δ, of 46 mV exists in some particular circuit of FIG. 1 due to processing variations. Because Δ is positive, when Vref=CKE=0V, the differential amplifier interprets these input voltages as calling for the DRAM 9 to be in a powered enabled mode. But clearly this is not what the system intended by sending Vref=CKE=0V; the system intended clocks to be disabled and that the DRAM 9 be placed in a low power mode.

Thus, the DRAM 9 enters a power enabled mode when the system has called for it to enter a low power mode. Obviously, this is not ideal, and the art would be benefited by a solution to this problem to allow for grounded Vref signals as an additional power saving measure in systems employing DRAMs (or other circuits) having input buffer circuitry 10 similar to that shown in FIG. 1.

SUMMARY

Disclosed herein are exemplary embodiments of an improved differential input buffer for receiving low power signals and associated methods. The disclosed buffer circuit comprises at least one differential amplifier for receiving as inputs an enable signal (e.g., a clock enable signal) and a reference signal, and provides a differential amplifier output representative of a comparison of the magnitude of the input signals. As improved, input buffer circuitry comprises a pull up stage to pull up the voltage of the differential amplifier output slightly higher during an output low condition. The pull up stage is preferably, but not necessarily, activated only during a problematic condition, such as when both input signals to the differential amplifier are low. By pulling up the output, the input buffer circuit enjoys improved margin, and is able to reliably signal a low power condition even when both inputs are low.

BRIEF DESCRIPTION OF THE DRAWINGS

Embodiments of the inventive aspects of this disclosure will be best understood with reference to the following detailed description and drawings, in which.

DETAILED DESCRIPTION

Figure 1:
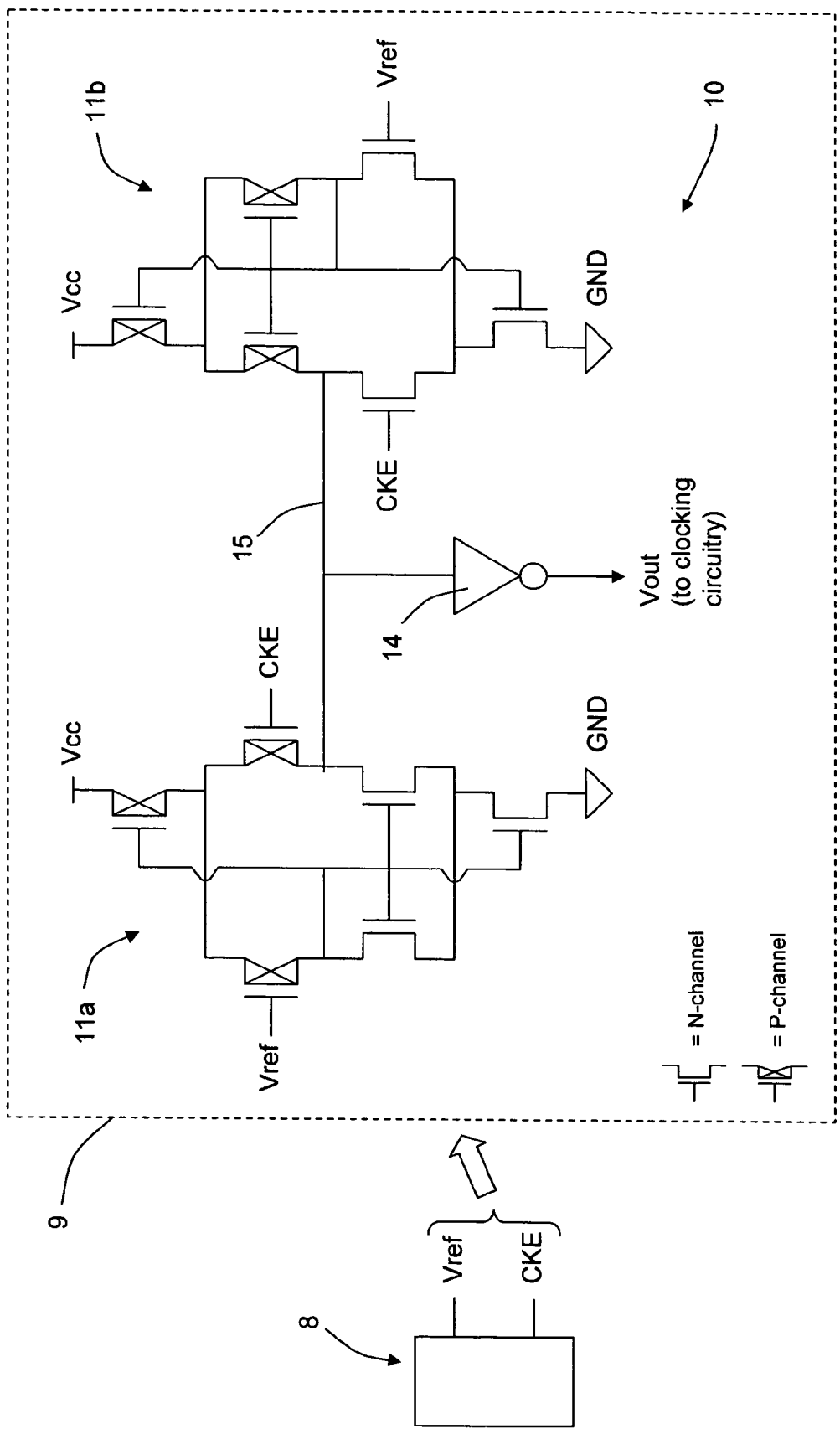
FIG. 1 illustrates a prior art input buffer circuit for receiving a reference and clock enable signal and for producing an output to clock enabling circuitry.
Figure 4:
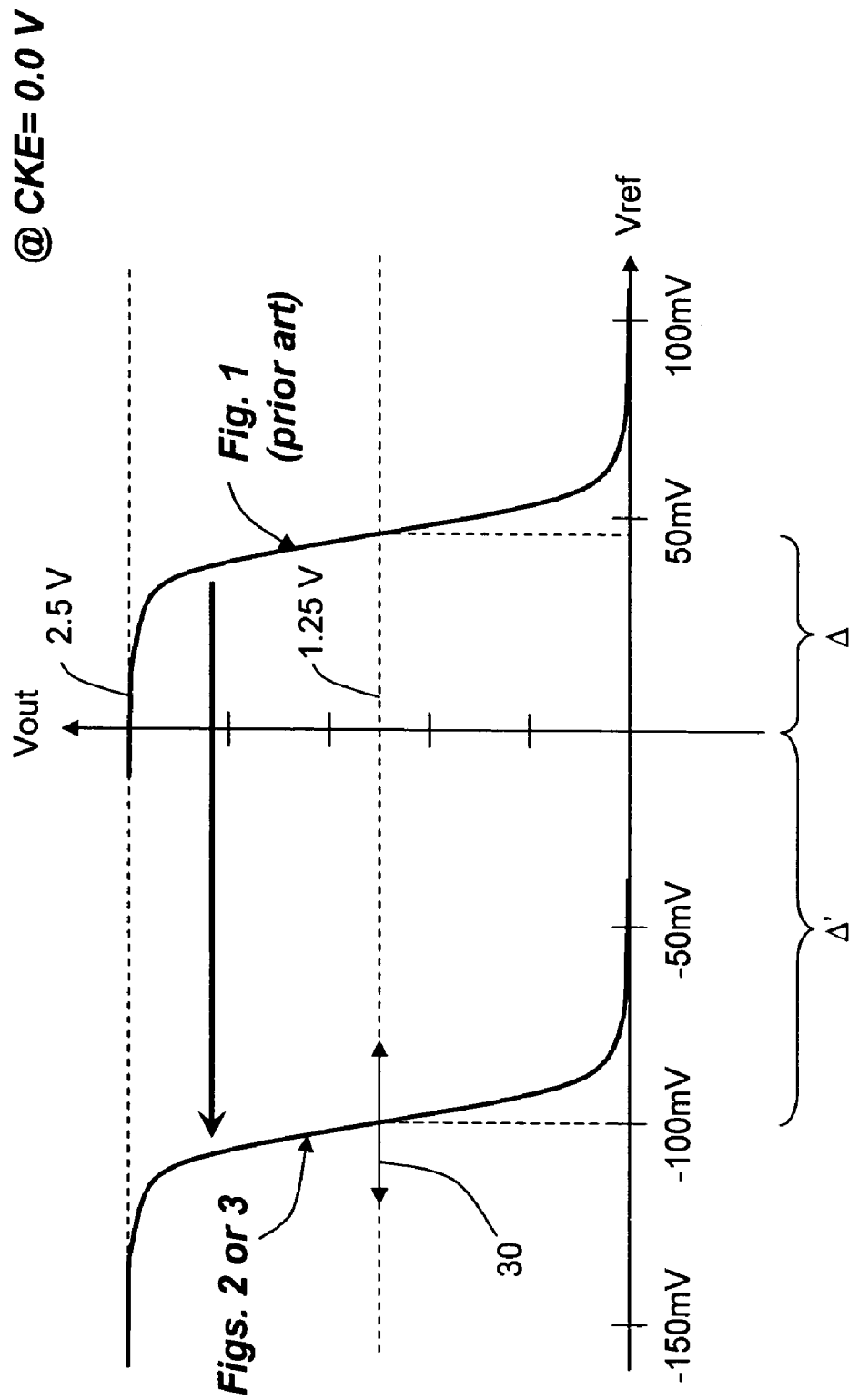
FIG. 4 illustrates the improvement that is realized when using the improved input buffer circuitry of FIG. 2 or 3 versus the prior art circuit of FIG. 1, and specifically shows the addition of margin to the circuit to better handle the condition where the reference and clock enable signals are both low.

The problem presented by the circuit of FIG. 1 and illustrated in FIG. 4 is essentially one of margin. When the differential voltage Δ is positive at the problematic low Vref/CKE condition using the prior art circuit of FIG. 1, the input buffer circuit 10 may not work as intended, and as explained above. However, when the differential voltage Δ is slightly negative, the circuit 10 works as intended: the amplifiers 11a, 11b output a logic '1,' and Vout (from inverter 14) is logic '0,' signifying the low power condition that the system intended. The solution to the problem is therefore to manipulate the output 15 from the differential amplifiers 11a, 11b to ensure that a small differential voltage Δ is present to add margin and overcome the variability in the fabrication of the input buffer circuit 10.

Figure 2:
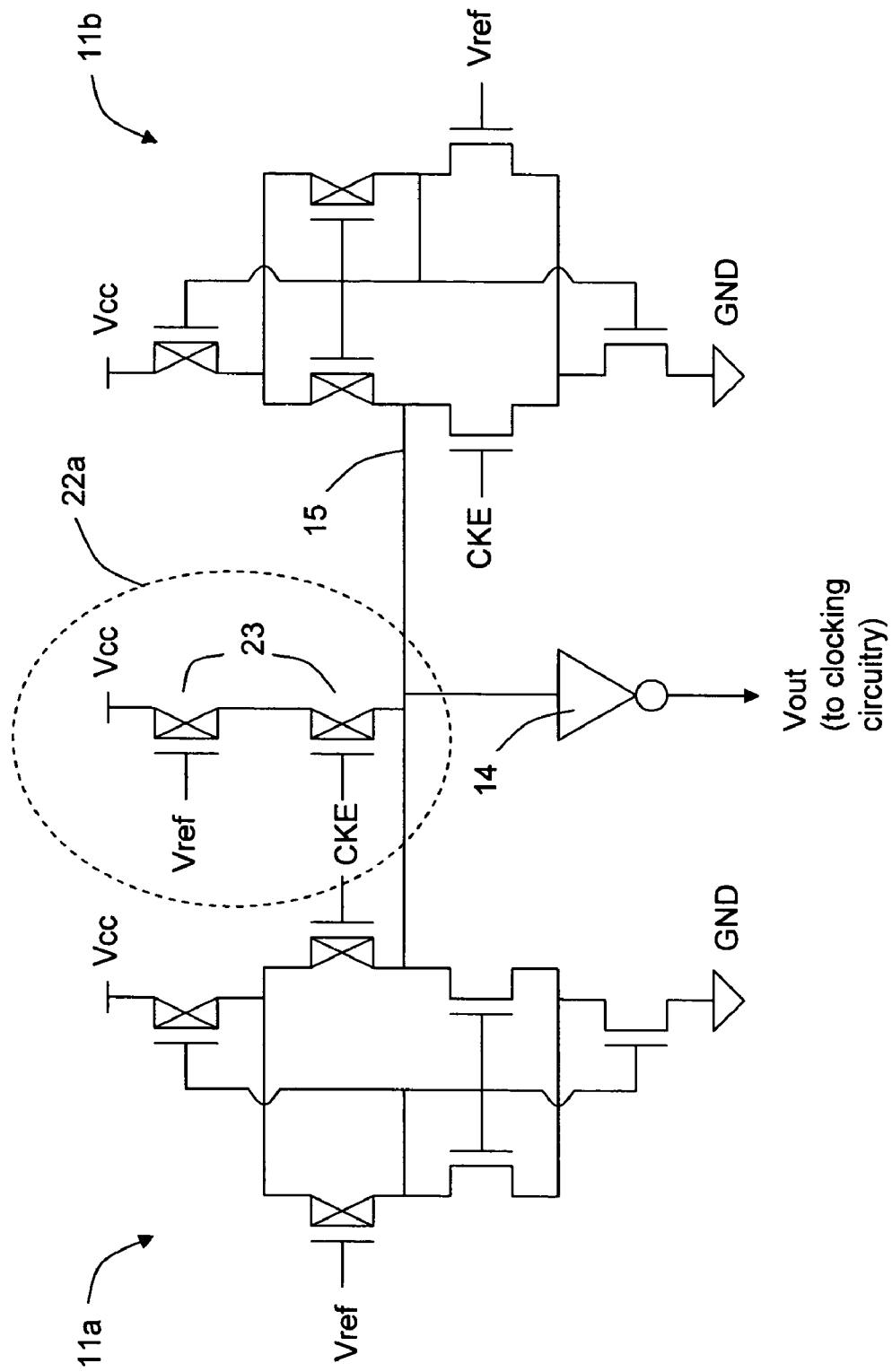
FIGS. 2 and 3 disclose an improved design for the input buffer circuitry of FIG. 1 which includes various designs for pull up stages to pull up output when output is low.
Figure 3:
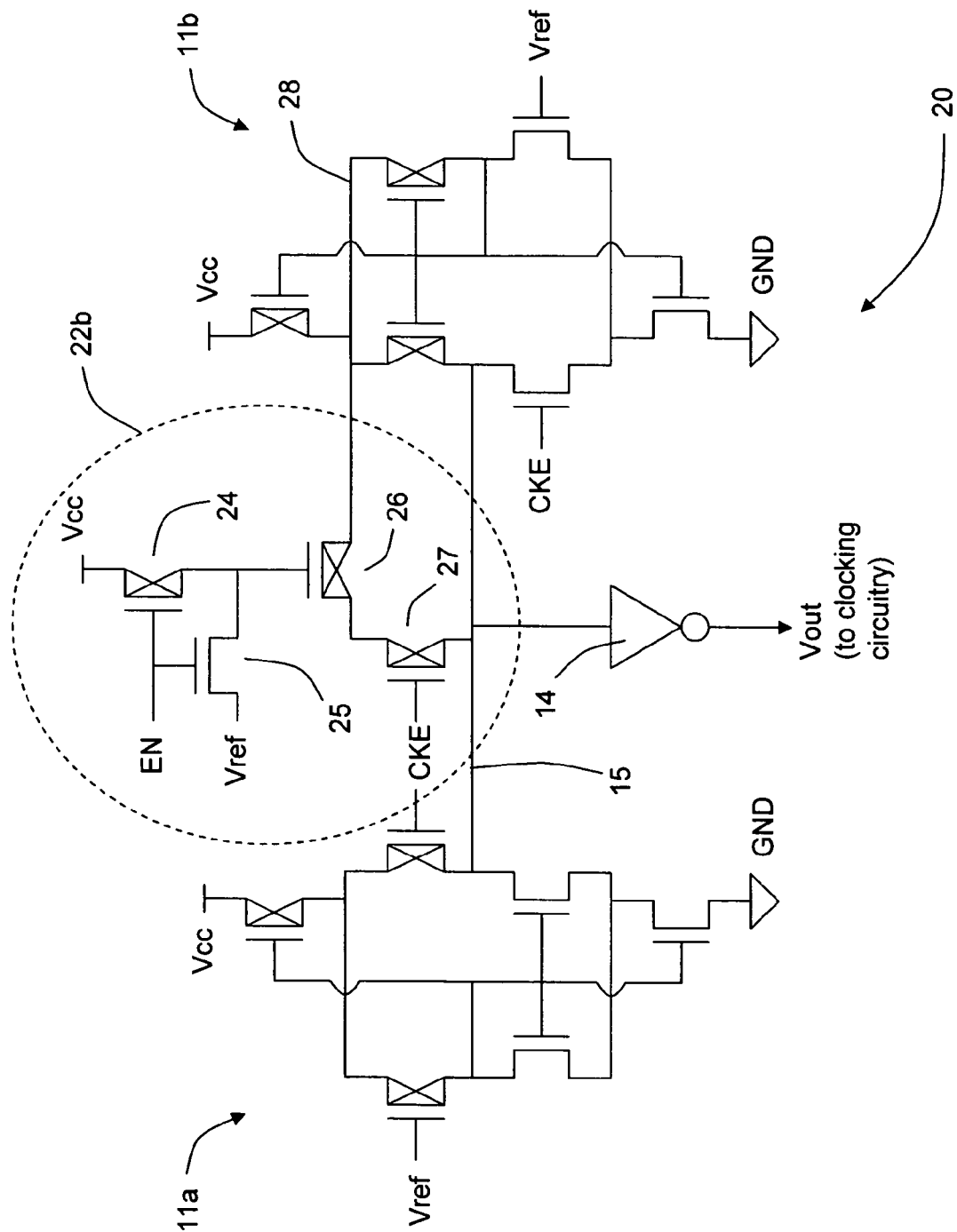

FIGS. 2 and 3 illustrate ways of achieving this solution by incorporating circuitry into the input buffer circuit 20 to pull up the output 15 of the differential amplifiers 11a, 11b. Specifically, pull up stages 22a (FIG. 2) or 22b (FIG. 3) have been added to the output 15 to pull the output of the differential amplifiers to a higher value when the problematic low Vref/CKE condition is encountered. In this condition, and as noted above, the output 15 from the amplifiers 11a, 11b is a low voltage, but by weakly coupling this output 15 to Vcc, this low voltage can be drawn upward slightly (e.g., by approximately 150 mV), with the effect that Δ' (the differential voltage for improved input buffer circuit 20) is seen to be slightly negative (e.g., approximately −100 mV).

Specifically, and referring to FIG. 2, the pull up stage 22a comprises two P-channel transistors 23 serially coupled between the DRAM 9's voltage source (Vcc) and differential amplifier output 15. These transistors 23 are preferably gated by the same Vref and CKE signals that are being assessed to determine whether the DRAM should enter a low power condition, but this need not necessarily be the case as discussed below. When the problematic low Vref/CKE condition occurs, both of these transistors 23 will be on and will draw some amount of current. By contrast, when either of the Vref or CKE signals are not low, at least one of transistors 23 will be off, and hence output 15 will be disconnected from (and not pulled up by) Vcc. Thus, pull up stage 22a is not activated when the problematic low Vref/CKE condition is not encountered, and would function just as the prior art circuit 10 of FIG. 1, which is ideal because the pull up stage 22a does not otherwise affect other beneficial aspects of the circuit 10.

The extent to which the differential amplifier output 15 is pulled up depends on the amount of current transistors 23 are allowed to draw relative to the current draw through the differential amplifiers 11a, 11b in the low Vref/CKE condition. Generally, a differential voltage Δ' of −100 mV is considered acceptable to account for circuit variability, and therefore, it may be desirable to increase the output 15 of the differential amplifier by 150 mV, which would provide the desired margin (at least as applied to the circuit of FIG. 1). As one skilled in the art will understand, tailoring the exact amount of this increased voltage on output 15 can be effected by adjusting the length or width of the transistors 23, with smaller length or wider transistors 23 providing increasing voltage at the output 15. Additionally, discrete resistors can be added into the serial path of the transistors 23 if necessary. The exact amount of tailoring to pull up the voltage of the differential amplifier output 15 when it output a low condition will depend on expected circuit variability and design choice.

An alternative pull up stage 22b useful in solving the problems of the prior art is shown in FIG. 3. In this example, the pull up stage 22b can be enabled through the provision of an enable signal ("EN"), which may come from the system but which is preferably generated by the DRAM in which the input circuitry is placed. When the pull up stage is enabled and a low power condition is required, EN is placed high, P-channel transistor 24 turns off, and N-channel transistor 25 turns on. Assuming Vref is low, P-channel transistor 26 is turned on, and P-channel transistor 27 is on by virtue of CKE being low. This couples rail 28 of the N-channel differential amplifier 11b, which is relatively high during the problematic low Vref/CKE condition through transistors 26 and 27 to the differential amplifier output 15 to allow it to be pulled up. By tapping pull up potential from rail 28, the amount of pull up is made variable, with greater pull up being achieved when it is needed most. The approach is roughly equivalent to adding a series resistor to the pull-up stack. In so doing, the pull-up path is weakened by using the existing bias device in 11b to help limit current.

Using either the input buffer circuits 20 of FIG. 2 or 3 has the effect of pulling up differential amplified output 15 during the problematic low Vref/CKE condition, and shifts the differential voltage Δ' negative. The results are shown in FIG. 4, which shows a differential voltage of approximately −100 mV, which constitute approximately a 150 mv shift from the exemplary prior art circuit of FIG. 1. By pulling up the differential amplifier output 15, the differential voltage has been made suitably negative to accommodate any swings in that value due to circuit variability 30.

The pull up stages 22a, 22b can be formulated in many different ways. For example, while the pull up stages preferably receive Vref and CKE as their inputs to allow for pull up only during the problematic low Vref/CKE condition, this is not strictly necessary, and in some designs and applications an always-on pull up device—e.g., a resistor between the differential output 15 and Vcc—an be used. Or, in other designs, only one of Vref and CKE could be used as an input to control the pull up stages 22a, 22b. Moreover, and as noted earlier, only one differential amplifier 11a or 11b need be used. Moreover, the differential amplifier circuit used need not be that disclosed, but could constitute any differential amplifier architecture or design.

Additionally, although the disclosed improved input circuit 20 has been illustrated as particularly useful when implemented in a DRAM, the circuit and techniques disclosed herein can be utilized in other integrated circuits as well.

"Coupled" as used herein should not necessarily be construed as requiring a direct connection between two coupled components. Two components can be functionally coupled even if an intermediary component intervenes between them.

"Microprocessor" as used herein should be construed as covering any logic device or collection of logic devices suitable for providing the reference and clock enable signals to the DRAM or other integrated circuit employing the disclosed improved input buffer circuit. Hence, a microprocessor can, but need not, constitute a traditional microprocessor, such as a Pentium™ microprocessor.

It should be understood that the inventive concepts disclosed herein are capable of many modifications. To the extent such modifications fall within the scope of the appended claims and their equivalents, they are intended to be covered by this patent.

What is claimed is:

1. An input buffer circuit for an integrated circuit, comprising:
   at least one differential amplifier, the differential amplifier comprising an output and two inputs, the inputs comprising a reference signal and an enable signal, the differential amplifier for comparing the inputs and determining at its output if the integrated circuit should enter a low power mode;
   a pull up stage coupled between the output and a voltage source for raising the voltage of the output; and
   an inverter connected to the output.

2. The input buffer of claim 1, wherein the pull up stage receives as inputs the reference signal and the enable signal.

3. The input buffer of claim 2, wherein the pull up stage comprises transistors, and wherein the reference signal and enable signal are input into gates of the transistors.

4. The input buffer of claim 3, wherein the transistors are serially coupled between the voltage source and the output.

5. The input buffer of claim 2, wherein the voltage source comprises a rail of the differential amplifier.

6. The input buffer of claim 1, wherein the enable signal comprises a clock enable signal for enabling at least one clock in the integrated circuit.

7. The input buffer of claim 1, wherein the at least one differential amplifier comprises two differential amplifiers, and wherein the output is common to both differential amplifiers.

8. The input buffer of claim 7, wherein the differential amplifiers comprise an N-channel differential amplifier and a P-channel differential amplifier.

9. The input buffer of claim 1, wherein the pull up stage raises the voltage of the output to substantially less than a voltage level of the voltage source.

10. The input buffer of claim 1, wherein the pull up stage is only active when the reference signal and the enable signal are low.

11. An input buffer circuit for an integrated circuit, comprising:
    at least one differential amplifier, the differential amplifier comprising an output and two inputs, the inputs comprising a reference signal and an enable signal, the differential amplifier for comparing the inputs and determining at its output if the integrated circuit should enter a low power mode; and
    means for raising the voltage of the output; and
    an inverter connected to the output.

12. The input buffer of claim 11, wherein the means receives as inputs the reference signal and the enable signal.

13. The input buffer of claim 11, wherein the means is coupled between the voltage source and the output.

14. The input buffer of claim 13, wherein the voltage source comprises a rail of the differential amplifier.

15. The input buffer of claim 11, wherein the enable signal comprises a clock enable signal for enabling at least one clock in the integrated circuit.

16. The input buffer of claim 11, wherein the at least one differential amplifier comprises two differential amplifiers, and wherein the output is common to both differential amplifiers.

17. The input buffer of claim 11, wherein the means raises the voltage of the output to substantially less than a voltage level of the voltage source.

18. The input buffer of claim 11, wherein the means is only active when the reference signal and the enable signal are low.

19. An integrated circuit, comprising:
    an input buffer circuit, comprising
       at least one differential amplifier, the differential amplifier comprising an output and two inputs, the inputs comprising a reference signal and an enable signal, and
       a pull up stage coupled between the output and a voltage source for raising the voltage of the output; and
    a clocking circuit coupled to the output, wherein the clocking circuit is disabled when the enable signal is low.

20. The integrated circuit of claim 19, wherein the pull up stage receives as inputs the reference signal and the enable signal.

21. The integrated circuit of claim 20, wherein the pull up stage comprises transistors, and wherein the reference signal and enable signal are input into gates of the transistors.

22. The integrated circuit of claim 21, wherein the transistors are serially coupled between the voltage source and the output.

23. The integrated circuit of claim 20, wherein the voltage source comprises a rail of the differential amplifier.

24. The integrated circuit of claim 19, wherein the enable signal comprises a clock enable signal for enabling at least one clock in the clocking circuitry.

25. The integrated circuit of claim 19, wherein the at least one differential amplifier comprises two differential amplifiers, and wherein the output is common to both differential amplifiers.

26. The integrated circuit of claim 19, further comprising an inverter connected between the output and the clocking circuitry.

27. The integrated circuit of claim 19, wherein the pull up stage raises the voltage of the output to substantially less than a voltage level of the voltage source.

28. The integrated circuit of claim 19, wherein the pull up stage is only active when the reference signal and the enable signal are low.

29. The integrated circuit of claim 19, wherein the integrated circuit is a DRAM.

30. A system, comprising:
    a microprocessor for sending a reference signal and an enable signal to an integrated circuit; and
    an integrated circuit, comprising:
       an input buffer circuit, comprising at least one differential amplifier, the differential amplifier for receiving the reference signal and the enable signal, the differential amplifier further comprising an output and a pull up stage coupled between the output and a voltage source for raising the voltage of the output, and
       a clocking circuit coupled to the output, wherein the clocking circuit is disabled when the enable signal is low.

31. The system of claim 30, wherein the pull up stage receives as inputs the reference signal and the enable signal.

32. The system of claim 31, wherein the pull up stage comprises transistors, and wherein the reference signal and enable signal are input into gates of the transistors.

33. The system of claim 32, wherein the transistors are serially coupled between the voltage source and the output.

34. The system of claim 31, wherein the voltage source comprises a rail of the differential amplifier.

35. The system of claim 30, wherein the enable signal comprises a clock enable signal for enabling at least one clock in the clocking circuitry.

36. The system of claim 30, wherein the at least one differential amplifier comprises two differential amplifiers, and wherein the output is common to both differential amplifiers.

37. The system of claim 30, further comprising an inverter connected between the output and the clocking circuitry.

38. The system of claim 30, wherein the pull up stage raises the voltage of the output to substantially less than a voltage level of the voltage source.

39. The system of claim 30, wherein the pull up stage is only active when the reference signal and the enable signal are low.

40. The system of claim 30, wherein the integrated circuit is a DRAM.

41. A method of entering a low power mode in an integrated circuit, comprising:
  receiving a reference signal and an enable signal at the input of least one differential amplifier of the integrated circuit, wherein the enable signal and the reference signal are of approximately the same voltage level;
  outputting on an output of the differential amplifier a voltage signal; and
  adjusting the voltage signal on the output, wherein the adjusted voltage signal indicates a low power mode to the integrated circuit.

42. The method of claim 41, wherein adjusting the voltage signal depends on a status of the reference signal and the enable signal.

43. The method of claim 41, wherein adjusting the voltage signal comprises increasing the voltage signal.

44. The method of claim 41, wherein increasing the voltage signal comprises increasing the voltage signal to a voltage substantially less than a voltage provided by a voltage source on the integrated circuit.

45. The method of claim 41, wherein adjusting the voltage signal comprises coupling the output to a voltage source.

46. The method of claim 45, wherein the coupling occurs through at least one transistor.

47. The method of claim 45, wherein the voltage source comprises a rail of the differential amplifier.

48. The method of claim 41, wherein the enable signal comprises a clock enable signal.

49. The method of claim 41, wherein the at least one differential amplifier comprises two differential amplifiers, and wherein the output is common to both differential amplifiers.

50. The method of claim 41, further comprising inverting the adjusted voltage signal.

51. The method of claim 41, wherein the approximately the same voltage level is ground.

52. The method of claim 41, wherein the voltage signal is adjusted only when the reference signal and the enable signal are low.

53. A method of entering a low power mode in an integrated circuit using a microprocessor, comprising:
  generating a grounded reference signal and a grounded enable signal at the microprocessor to indicate a low power mode to the integrated circuit;
  receiving the reference signal and an enable signal at the input of least one differential amplifier of the integrated circuit;
  outputting on an output of the differential amplifier a voltage signal; and
  adjusting the voltage signal on the output, wherein the adjusted voltage signal indicates a low power mode.

54. The method of claim 53, wherein adjusting the voltage signal comprises increasing the voltage signal.

55. The method of claim 53, wherein increasing the voltage signal comprises increasing the voltage signal to a voltage substantially less than a voltage provided by a voltage source on the integrated circuit.

56. The method of claim 53, wherein adjusting the voltage signal comprises coupling the output to a voltage source.

57. The method of claim 56, wherein the coupling occurs through at least one transistor.

58. The method of claim 56, wherein the voltage source comprises a rail of the differential amplifier.

59. The method of claim 53, wherein the enable signal comprises a clock enable signal.

60. The method of claim 53, wherein the at least one differential amplifier comprises two differential amplifiers, and wherein the output is common to both differential amplifiers.

61. The method of claim 53, further comprising inverting the adjusted voltage signal.

62. The method of claim 61, further comprising sending the adjusted inverted voltage signal to clocking circuitry of the DRAM to disable it.

63. The method of claim 53, wherein the voltage signal is adjusted only when the reference signal and the enable signal are grounded.

64. The method of claim 53, wherein the integrated circuit is a DRAM.

65. An integrated circuit, comprising:
  at least one differential amplifier, the differential amplifier comprising an output and two inputs, the inputs comprising a reference signal and a clock enable signal, the differential amplifier for comparing the inputs and determining at its output if the integrated circuit should enter a low power mode by disabling clocking circuitry in the integrated circuit; and
  a pull up stage coupled between the output and a voltage source for raising the voltage of the output.

66. The input buffer of claim 65, wherein the pull up stage receives as inputs the reference signal and the clock enable signal.

67. The input buffer of claim 66, wherein the pull up stage comprises transistors, and wherein the reference signal and clock enable signal are input into gates of the transistors.

68. The input buffer of claim 67, wherein the transistors are serially coupled between the voltage source and the output.

69. The input buffer of claim 65, wherein the at least one differential amplifier comprises two differential amplifiers, and wherein the output is common to both differential amplifiers.

70. The input buffer of claim 69, wherein the differential amplifiers comprise an N-channel differential amplifier and a P-channel differential amplifier.

71. The input buffer of claim 65, wherein the pull up stage raises the voltage of the output to substantially less than a voltage level of the voltage source.

72. The input buffer of claim 65, wherein the pull up stage is only active when the reference signal and the enable signal are low.

* * * * *

UNITED STATES PATENT AND TRADEMARK OFFICE
CERTIFICATE OF CORRECTION

| | | |
|---|---|---|
| PATENT NO. | : 7,327,620 B2 | Page 1 of 1 |
| APPLICATION NO. | : 10/865218 | |
| DATED | : February 5, 2008 | |
| INVENTOR(S) | : Casper et al. | |

It is certified that error appears in the above-identified patent and that said Letters Patent is hereby corrected as shown below:

On the face page, in field (75), in "Inventors", in column 1, line 1, delete "Steve" and insert -- Stephen --, therefor.

Signed and Sealed this

Seventeenth Day of June, 2008

JON W. DUDAS
*Director of the United States Patent and Trademark Office*